United States Patent [19]

Askin et al.

[11] Patent Number: 4,737,836

[45] Date of Patent: Apr. 12, 1988

[54] VLSI INTEGRATED CIRCUIT HAVING PARALLEL BONDING AREAS

[75] Inventors: Haluk O. Askin, Clinton Corners; Doyle E. Beaty, Jr., Wappingers Falls; Joseph R. Cavaliere, Hopewell Junction; Guy Rabbat, Wappingers Falls; John Balyoz, Hopewell Junction; Achilles A. Sarris, Fishkill, all of N.Y.

[73] Assignee: International Business Machines Corporation, Armonk, N.Y.

[21] Appl. No.: 842,062

[22] Filed: Mar. 18, 1986

Related U.S. Application Data

[63] Continuation of Ser. No. 567,020, Dec. 30, 1983, abandoned.

[51] Int. Cl.$^4$ ............... H01L 27/10; H01L 23/48
[52] U.S. Cl. ........................ 357/45; 357/40; 357/68; 357/71
[58] Field of Search ............ 357/45, 71, 68, 40

[56] References Cited

U.S. PATENT DOCUMENTS

| | | | |
|---|---|---|---|
| 3,365,707 | 1/1968 | Mayhew | 357/41 |
| 3,621,562 | 11/1971 | Patel | 357/40 |
| 3,808,475 | 4/1974 | Buelow et al. | 357/45 |
| 3,983,619 | 10/1976 | Kubo | 357/45 |
| 4,255,672 | 3/1981 | Ohno et al. | 357/51 |
| 4,295,149 | 10/1981 | Balyoz et al. | 357/51 |
| 4,322,821 | 3/1982 | Lohstroh et al. | 357/59 |
| 4,500,906 | 2/1985 | Ohno et al. | 357/45 |

FOREIGN PATENT DOCUMENTS

| | | | |
|---|---|---|---|
| 1106980 | 8/1981 | Canada | 357/45 |
| 0001209 | 4/1979 | European Pat. Off. | 357/45 |
| 0021661 | 7/1981 | European Pat. Off. | 357/45 |
| 55-82448 | 1/1980 | Japan | 357/45 |

Primary Examiner—Martin H. Edlow
Assistant Examiner—Jerome Jackson
Attorney, Agent, or Firm—Sughrue, Mion, Zinn, Macpeak, and Seas

[57] ABSTRACT

A very large scale multicell integrated circuit is provided with significantly improved circuit density. Both active and passive circuit elements are formed in a semiconductor substrate using ordinary diffusion techniques. Connectors, preferably made of polysilicon material, are then formed on the surface of the substrate. The connectors have bonding pad areas located along predetermined lines where metal connectors of later-formed metallization layers can be located. Some of the connectors have bonding pad areas connected to circuit elements while others are left unconnected. The subsequently formed metallization layers can then be used to connect together various ones of the circuit elements and multiple ones of the cells together in any desired circuit configuration using the polysilicon connectors.

12 Claims, 3 Drawing Sheets

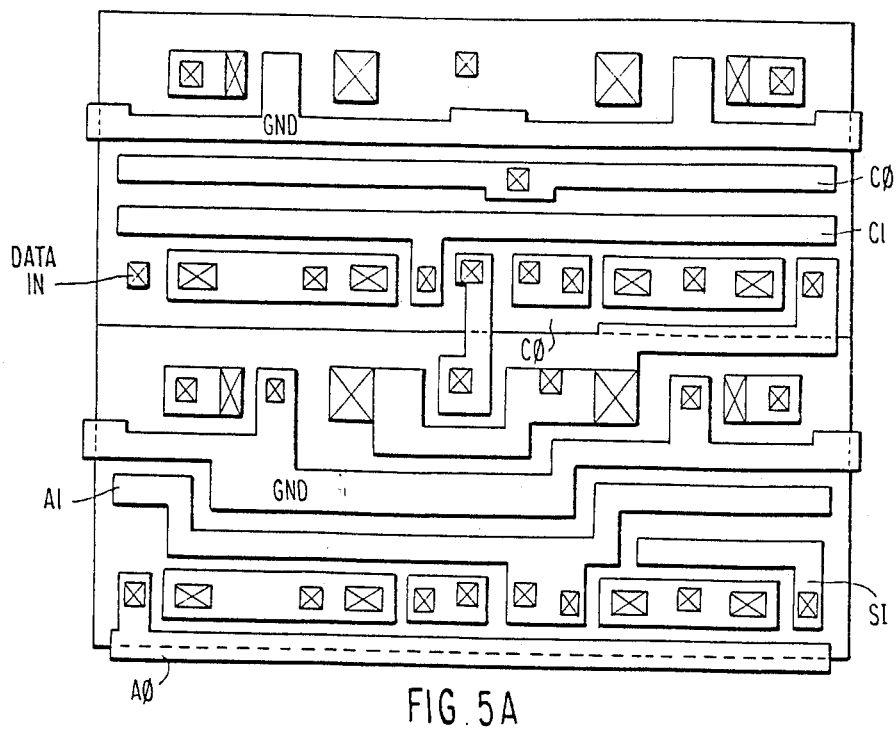
FIG. 5A
FIG. 5B
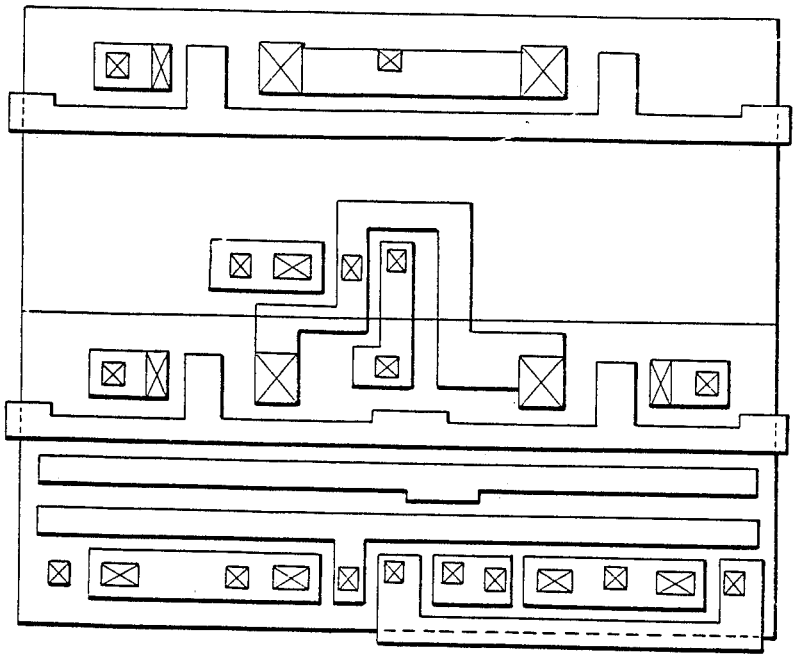

VLSI INTEGRATED CIRCUIT HAVING PARALLEL BONDING AREAS

This is a continuation of application Ser. No. 567,020, now abandoned, filed Dec. 30, 1983.

BACKGROUND OF THE INVENTION

The present invention relates to a VLSI (Very Large Scale Integration) integrated circuit having a significantly improved circuit density. More particularly, the invention pertains to such a VLSI circuit composed of a plurality of identical "multicells", each of which is identical to all other cells and each of which is composed of a number of transistors, diodes and resistors which are only partially interconnected prior to final device fabrication so that the various cells can be selectively configured in a desired logic circuit configuration and multiple ones of the cells can be connected together to implement any desired function. That is, the cells are not limited to any particular logic circuit configuration.

In general, to fabricate a VLSI device, a large chip, referred to as a "masterslice" is first produced. The masterslice will have formed thereon a number of logic circuits, typically OR, NOR, AND, NAND and EXCLUSIVE-OR gates, inverters, multiplexers, and the like. The book *Integrated Circuits, A Basic Course for Engineers and Technicians*, R. G. Hibberd, McGraw-Hill Book Company, 1969, pp. 136–142, gives a good general discussion of such devices. The master slices are stocked, and then later the various logic circuits thereon are wired together in a desired configuration to provide a logic circuit system which will perform a desired digital processing function.

This approach, although capable of yielding VLSI devices which will perform as desired, is nevertheless disadvantageous in that it is not possible to produce any one masterslice in which all of the logic circuits thereon can be used in all possible applications. That is, there is generally a relatively great waste of chip area because a large number of the logic circuits cannot be used in any given application.

U.S. Pat. No. 4,255,672 to Ohno et al. describes an improvement over the above-described basic technique wherein a plurality of identical emitter-coupled logic circuit cells are fabricated upon a single chip. In addition to the logic circuit cells, there are also fabricated upon the same chip a plurality of driver circuits composed of larger transistors having a greater drive capability than the transistors of which the logic circuit cells are composed. Although the approach of Ohno et al. may lead to some improvement in integration density, nonetheless, the approach suffers significant drawbacks in that the driver circuits take up a large portion of the overall available chip area. Also, complex wiring techniques must be employed to make connections between the ordinary logic circuit cells and the driver circuits since the positional inter-relationship between the logic circuit cells and the driver circuits cannot be optimum for all applications.

Accordingly, it is an object of the present invention to provide a VLSI integrated circuit in which maximum utilization is made of all circuit cells on the chip.

It is a further object of the invention to provide such a VLSI integrated circuit in which no complex wiring patterns are required to configure the logic circuit cells in the desired pattern.

SUMMARY OF THE INVENTION

These, as well as other objects of the invention, are met by a semiconductor integrated circuit chip (masterslice) comprising a plurality of identical cells (multicells) arranged in a matrix of columns and rows. Each of the cells includes a plurality of diffused areas on the surface of the chip, with the diffused areas forming both active and passive semiconductor devices or elements. The semiconductor elements employed with the invention are not complete logic circuits at the time that the initial fabrication of the chip is completed, but are only elements such as transistors and diodes (active elements) and resistors (passive elements). Some of these elements may be partially interconnected. It is only when the chip is ready to be configured into a particular logic circuit system, which includes higher-level logic circuits such as adders, registers, comparators and the like, that the various circuit elements that make up the cells are completely interconnected.

A plurality of connectors are formed on the surface of the chip. These connectors, which are preferably made of polysilicon material, have bonding areas (pads) which are located in parallel lines on the surface of the chip. This leaves space for wiring channels between lines of connector bonding areas on the surface of the chip where metal connectors of later-formed metallization layers can be located.

Some of the bonding areas of some of the connectors may be coupled to predetermined ones of the semiconductor elements, although most of the bonding areas of the connectors should be left unconnected to provide maximum flexibility in circuit configuration when the cell is finally wired up in a desired logic circuit configuration. It is also preferred that the active and passive elements be formed on the chip in alignment with the bonding areas of the connectors to provide for maximum room between the lines of bonding areas of the connectors for later use by the metallization layers.

In a preferred embodiment, each cell is provided with two transistors, four diodes and four resistors. It has been found that this configuration provides a very high utilization rate of circuit elements among cells so that there is very little waste of circuit elements when the device is connected in the final desired logic circuit system configuration. In this preferred embodiment, the bonding areas are arranged along three lines, one running lengthwise through the approximate middle of the cell, and two running lengthwise on opposite sides of the cell. The two transistors are alinged with the bonding areas on one side of the cell, and the diodes aligned with the bonding areas on the other side of the cell. The resistors are aligned with the bonding areas which fall along the line running through the approximate middle of the cell. In this case, it is preferred that some of the connectors which do not have bonding areas already connected to any of the circuit elements to be placed about in the middle of the cell and running orthogonal to the lines of bonding areas on the two sides of the cell. The four resistors may be formed as two diffused areas which have center taps at bonding areas of two of the connectors.

Chips having the above-described configuration may be stocked. Later, when it is desired to wire the various cells together in a particular desired logic circuit system configuration, one or more metallization layers can be formed to interconnect the circuit elements of the various cells and multiple ones of the cells together to achieve the needed logic function.

BRIEF DESCRIPTION OF THE DRAWINGS

FIGS. 5A and 5B are top views of wiring patterns used to form the circuit of FIG. 4 employing two laterally adjacent cells of the type of FIG. 1.

DESCRIPTION OF THE PREFERRED EMBODIMENTS

Figure 1:
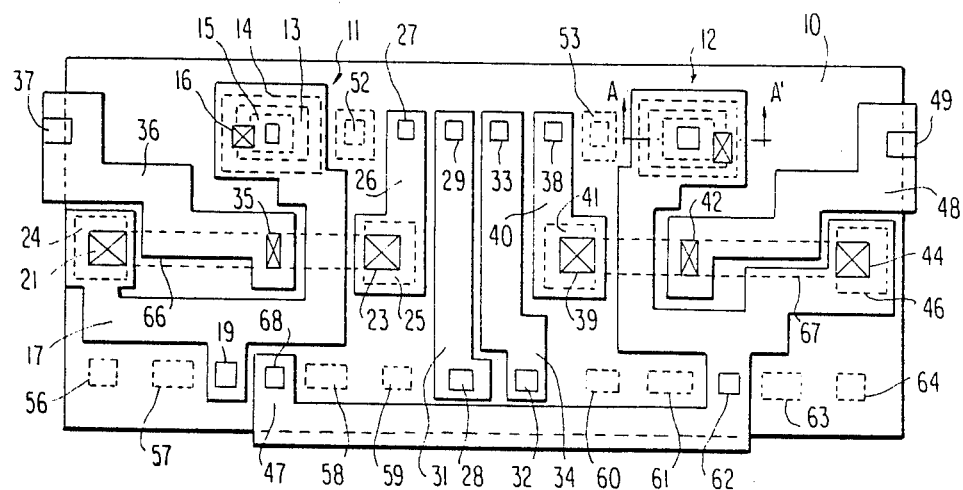
FIG. 1 is a top plan view of a single cell of a semiconductor integrated circuit chip of the invention.

Referring now to FIG. 1 of the drawings, there is shown therein a top plan view of a single cell of a semiconductor integrated circuit chip of the invention. There would of course by many more such cells, and the cells would be arranged in a matrix of columns and rows. However, only a single cell is shown here for convenience as all of the cells of the matrix of cells are identical.

The cell is constructed upon a semiconductor epitaxial layer 10, which may be formed of n⁻ silicon material. The cell includes two transistors 11 and 12 fabricated using ordinary integrated circuit techniques. The transistor 11, for instance, has an emitter region 15 surrounded by a base region 13. The base region 13 is, in turn, surrounded by a channel stop region 14 of an insulating material. This construction will be described in more detail below with reference to the cross-sectional view of FIG. 2. The structure of the transistor 12 is identical to that of the transistor 11.

Four diodes are also formed in the surface of the epitaxial layer 10. A first of these diodes has an anode 57 and a cathode 56, a second of the diodes has an anode 58 and a cathode 59, a third of the diodes has an anode 61 and a cathode 60, and a fourth of the diodes has an anode 63 and a cathode 64. In the state of fabrication of the device shown in FIG. 1, none of the anodes or cathodes of any of the diodes are connected to any of the other circuit elements.

Between the transistors on one side of the cell and the diodes on the other side of the cell are formed two diffusions 66 and 67 which are used as resistors. The diffusions extend generally parallel to the long sides of the rectangular cell.

Polysilicon connectors 17, 26, 34, 40, 47 and 48 are formed on the surface of the substrate 10 in the pattern shown. The connectors 17, 26, 34, 40, 47 and 48 are of course insulated from the substrate 10 except in the areas marked by "X". The connector 36 has a bonding area 37 at one end and is connected via a bonding area 35 to approximately the midpoint of the diffusion 66. The left end of the connector 17 is connected via a bonding area 21 to the left end of the diffusion 66 and extends to the right and upwardly where it makes contact with the base of the transistor 11 at a bonding area 16. The connector 17 also has a bonding area 19 at the lower edge of the cell. The connector 47 extends from a bonding area 68 along the lower edge of the cell to a bonding area 62, and thence upwards where it makes contact with the base of the transistor 12. The connector 47 is also connected with the right end of the diffusion 67 at a bonding area 44. The connector 26 runs from the right end of the diffusion 66 upwards to a bonding area 27 at the upper edge of the cell at a position adjacent the collector contact 52 of the transistor 11. Similarly, the connector 40 extends upwardly from the left end of the diffusion 67 to a bonding area 38 adjacent the collector contact 53 of the transistor 12.

Figure 2:
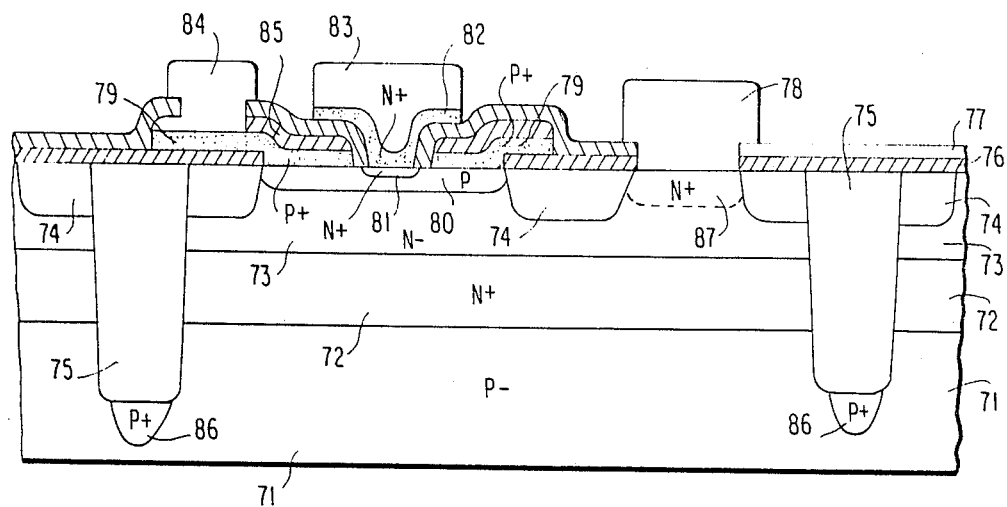
FIG. 2 is a cross-sectional view taken through a portion of the chip of FIG. 1.

Referring now to FIG. 2 of the drawings, here the cross-sectional view taken along line A—A of FIG. 1 is shown. All of the devices are constructed upon the surface of a P— type semiconductor substrate 71. A heavily doped N+ type semiconductor subcollector region 72 is first formed atop the P— type substrate 71 by well-known and well documented semiconductor processes. Next, a lightly doped N— type epitaxial layer 73 is formed, again, by the known epitaxial processes. This layer is indicated at 10 in FIG. 1.

Regions 74, 75 and 86 collectively form the isolation between active devices. Regions 86 are formed by known diffusion processes using P type dopant materials (such as Boron) prior to the formation of an N+ region 72. Regions 74 and 75 are constructed using known etching, deposition and oxidization processes to various depths into the substrate 71, subcollector 72 and epitaxial layer 73. Regions 74 and 75 basically consist of insulator type materials, such as silicon dioxide ($SiO_2$). The base region 80 of the transistor is formed by diffusing a P type dopant material (e.g. Boron) from the P+ type doped polysilicon layer 79 by known diffusion and high temperature heat cycling processes. The emitter region 81 of the transistor is similarly formed, by diffusing N type dopant materials (e.g. arsenic or phosphorus) from the N+ type doped polysilicon layer 82. Layers 83, 84 and 78 are contact metal layers for emitter, base and collector regions of the transistor, respectively. These metal layers are formed using highly conductive metals such as aluminium or copper by known evaporation processes. Polysilicon layers 79 and 82 are used as connecting layers between metal layers 78, 83 and 84 and the base emitter regions 80, 81 as shown in FIG. 2, and are also used to form the connectors 17, 26, 34, 40, 47 and 48 described with reference to FIG. 1. Layers 76, 77 and 85 are insulating layers used to isolate connectors from each other as well as to protect the surface of the semiconductor regions. These insulating layers are formed by known deposition and oxidation processes, and are made of materials such as silicon dioxide ($SiO_2$), and/or silicon nitride ($Si_3N_4$).

The heavily doped N+ region 87 is formed by known diffusion processes, by diffusing an N type dopant material in the N— type lightly doped epitaxial layer 73. The region 87 provides good ohmic contact to the collector region of the transistor by the metal layer 78.

Figure 3:
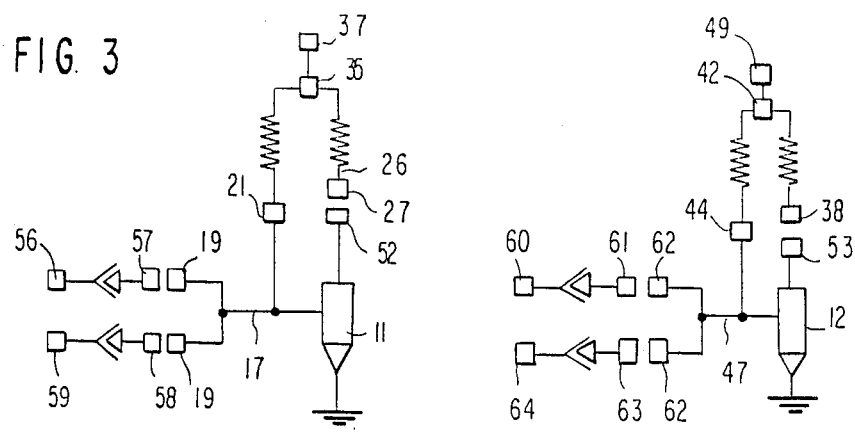
FIG. 3 is a circuit diagram of the cell of FIG. 1.

FIG. 3 is a schmatic representation of the cell of FIG. 1. In FIG. 3, reference numerals which are the same as those used in FIG. 1 identify corresponding components or elements.

Figure 4:
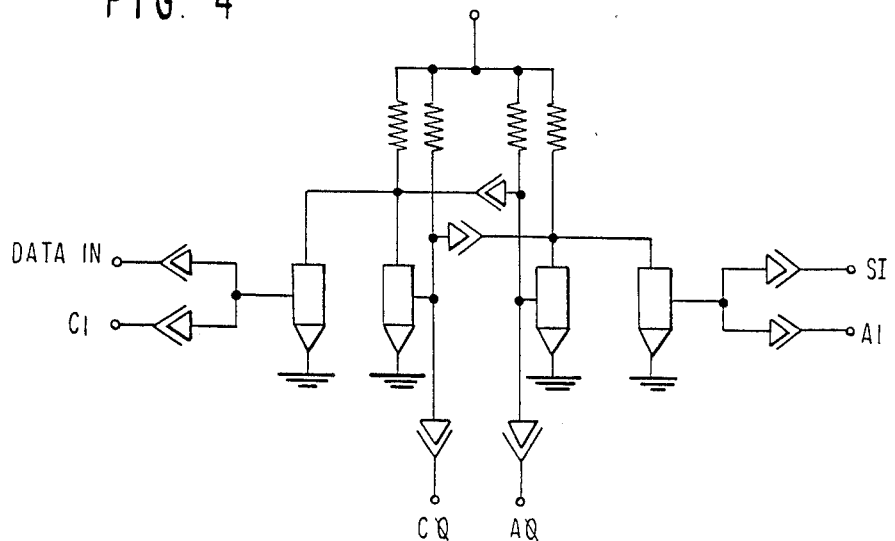
FIG. 4 is a circuit diagram showing two of the cells of FIG. 1 wired together to form a storage cell.

FIG. 4 is a schematic diagram of a common type of latch circuit which can be constructed using two of the cells of FIG. 1. FIGS. 5A and 5B are top views of wiring patterns used to interconnect two laterally adjacent cells of the type of FIG. 1. That is, the circuit of FIG. 4 is fabricated simply by forming the wiring patterns of FIGS. 5A and 5B over the laterally adjacent cells. Insulating layers (not shown) are formed between the cell and the wiring pattern of FIG. 5A, and between the wiring pattern of FIG. 5A and the wiring pattern of FIG. 5B. Other circuit arrangements are, of course, possible, the circuit of FIG. 4 and the corresponding wiring patterns of FIGS. 5A and 5B being given only as examples.

This completes the description of the preferred embodiments of the invention, although preferred embodiments have been described, it is believed that numerous modifications and alterations thereto would be apparent to one of ordinary skill in the art without departing from the spirit and scope of the invention.

We claim:

1. A semiconductor circuit chip comprising: a plurality of cells arranged substantially in matrix form, all cells on said chip being initially identical, each of said cells comprising in an original state a plurality of diffused areas on a surface of said chip; said diffused areas including both active and passive semiconductor device elements, and a plurality of original conductive connectors formed on said surface in each cell, said original conductive connectors having bonding areas defining a plurality of lines on said surface so as to leave substantially open wiring channels on said surface between said lines of bonding areas, said active and passive semiconductor elements being aligned with respective ones of said bonding areas, some of said original conductive connectors interconnecting ones of said semiconductor device elements but other of said original conductive connectors at least originally being left unconnected to said semiconductor device elements or connected to only one of said semiconductor device elements, so that the functionality of each said cell remains initially undefined, said cells being subsequently completely wired both internally and with respect to interconnections between cells by the addition of further conductive connectors, said further conductive connectors being insulated from and lying over said cells and said original conductive connectors, said semiconductor device elements being selectively interconnected by means of both said original conductive connectors and said further conductive connectors to form predetermined circuit configurations in a manner such that the type of circuit formed in each individual cell or cell combination as well as the overall functionality of said chip is determined by connections made by said further conductive connectors, said semiconductor device elements being disposed in at least general longitudinal alignment with said lines defined by said bonding areas of said connectors.

2. The semiconductor integrated circuit chip of claim 1, wherein said connectors are formed of a polysilicon material.

3. The semiconductor integrated circuit chip of claim 1, wherein at least some of said connectors have bonding areas coupled to predetermined ones of said semiconductor device elements.

4. The semiconductor integrated circuit chip of claim 3, wherein each said cell includes as semiconductor device elements at least two transistors, four diodes and four resistors.

5. The semiconductor integrated circuit chip of claim 4, wherein each said cell is rectangular in shape, and wherein said bonding areas are arranged along at least three said lines, each of said lines running parallel to a long side of said cell, at least one of said lines running approximately through the middle of said cell, and others of said lines lying along opposite sides of said cell.

6. The semiconductor integrated circuit chip of claim 5, wherein said two transistors are formed adjacent one of said opposite sides of said cell and are aligned with one of said lines, said resistors are formed as elongated diffused areas extending longitudinally aligned with said one of said lines running approximately through the middle of said cell, and said diodes lie along said side of said cell opposite said transistor and are aligned with a respective one of said lines.

7. The semiconductor integrated circuit chip of claim 6, wherein at least some of said connectors extend across said cell orthogonal to said long side of said cell and having bonding areas adjacent, but not connected to, bonding areas of some of said semiconductor device elements.

8. The semiconductor integrated circuit chip of claim 4, wherein said four resistors are formed as two diffused areas, each center tapped by a bonding area of respective ones of said connectors.

9. The semiconductor integrated circuit chip of claim 1, further comprising at least one metallization layer for connecting said semiconductor device elements in at least one of a predetermined logic or memory circuit configuration.

10. A semiconductor integrated circuit chip as claimed in claim 1, wherein said further connectors are added to connect selected ones of said bonding areas to ones of said semiconductor device elements.

11. A semiconductor integrated circuit chip as claimed in claim 1, wherein said original conductive connectors are of one type material and said further conductive connectors are of a different type material.

12. A semiconductor integrated circuit chip comprising: a plurality of cells arranged substantially in matrix form, all cells on said chip being initially identical, each of said cells comprising in an original state a plurality of diffused areas on a surface of said chip; said diffused areas including both active and passive semiconductor device elements, and a plurality of original conductive connectors formed on said surface in each cell, said original conductive connectors having bonding areas defining a plurality of lines on said surface so as to leave substantially open wiring channels on said surface between said lines of bonding areas, said active and passive semiconductor elements being aligned with respective ones of said bonding areas, some of said original conductive connectors interconnecting ones of said semiconductor device elements but others of said original conductive connectors at least originally being left unconnected to said semiconductor device elements or connected to only one of said semiconductor device elements, so that the functionality of each cell remains initially undefined, said cells being subsequently completely wired both internally and with respect to interconnections between cells by the addition of further conductive connectors, said semiconductor device elements being selectively interconnected by means of both said original conductive connectors and said further conductive connectors to form predetermined circuit configurations in a manner such that the type of circuit formed in each individual cell or cell combination as well as the overall functionality of said chip is determined by connections made by said further conductive connectors, said semiconductor device elements being disposed in at least general longitudinal alignment with said lines defined by said bonding areas of said connectors, said semiconductor device elements being generally disposed along at least two sides of each said cell, and said bonding areas being disposed in at least two parallel lines which are substantially parallel to lines defined by said semiconductor elements.

* * * * *